United States Patent
Kingston et al.

(10) Patent No.: US 9,983,247 B1
(45) Date of Patent: May 29, 2018

(54) EFFICIENTLY DETECTING PRESENCE OF A HIDDEN SIGNAL USING FREQUENCY DOMAIN MULTIPLICATION

(71) Applicant: L-3 Communications Corp., New York, NY (US)

(72) Inventors: Samuel C Kingston, Salt Lake City, UT (US); Radivoje Zarubica, Salt Lake City, UT (US); Ryan W Hinton, Salt Lake City, UT (US); Joshua D Gunn, Salt Lake City, UT (US); Thomas R Giallorenzi, Salt Lake City, UT (US)

(73) Assignee: L-3 Communications Corp., New York, NY (US)

( * ) Notice: Subject to any disclaimer, the term of this patent is extended or adjusted under 35 U.S.C. 154(b) by 11 days.

(21) Appl. No.: 15/409,060

(22) Filed: Jan. 18, 2017

(51) Int. Cl.
*H04B 7/02* (2018.01)
*H04L 1/02* (2006.01)
*G01R 29/08* (2006.01)

(52) U.S. Cl.
CPC ..... *G01R 29/0892* (2013.01); *G01R 29/0878* (2013.01)

(58) Field of Classification Search
CPC ..... H04L 7/007; H04L 7/042; G01R 29/0892; G01R 29/0878
See application file for complete search history.

(56) References Cited

U.S. PATENT DOCUMENTS

| | | | |
|---|---|---|---|
| 6,453,252 B1 * | 9/2002 | Laroche | G06K 9/00523 702/73 |
| 2006/0215775 A1 * | 9/2006 | Lin | H03D 3/002 375/260 |
| 2006/0227886 A1 * | 10/2006 | Li | H04L 25/03159 375/260 |
| 2015/0355322 A1 * | 12/2015 | Oshima | G01S 13/003 342/116 |

* cited by examiner

*Primary Examiner* — Shuwang Liu
*Assistant Examiner* — Sung Ahn
(74) *Attorney, Agent, or Firm* — Kirton McConkie; Brian Tucker (57) ABSTRACT

The presence of a hidden signal can be detected efficiently using frequency domain multiplication. A detector system can be employed to search for a hidden signal across a wide spectrum in real time. The detector system can divide multiple antenna inputs into a series of blocks and then convert these blocks to the frequency domain possibly in a parallel fashion. Corresponding blocks from each input can then be conjugate multiplied, and the results of this conjugate multiplication can then be averaged over time. If a signal is hidden in the inputs, this averaging will reduce the noise floor thereby revealing the presence of the hidden signal at a particular frequency.

20 Claims, 10 Drawing Sheets

EFFICIENTLY DETECTING PRESENCE OF A HIDDEN SIGNAL USING FREQUENCY DOMAIN MULTIPLICATION

CROSS-REFERENCE TO RELATED APPLICATIONS

N/A

BACKGROUND

In order to detect the presence of a signal hidden deep in the noise floor, special detection techniques, such as interferometry or radiometry, are required. An interferometer or a radiometer can be employed to detect the presence of a signal in the noise floor by correlating two antenna inputs or one antenna input with itself respectively. Traditional interferometers and radiometers are only capable of instantaneously processing a narrow spectrum (e.g., 100 MHz). The primary reason for this limitation is that these traditional techniques repeatedly compare (or correlate) a slice of one antenna input to a series of slices of the other antenna input in an attempt to identify a match. The number of comparisons that would have to be made to simultaneously process a wide spectrum becomes prohibitive.

When it is necessary to search for a hidden signal over a wider spectrum using the traditional techniques, smaller portions of the spectrum can be processed serially. In particular, the spectrum can be divided into portions and then each portion can be processed one at a time such that, at any given time, only a small portion of the spectrum will be examined for the presence of the hidden signal. If the hidden signal happens to appear at a frequency that is not with the portion currently being processed, the system will not detect its presence. Therefore, at best, these traditional techniques are inefficient for detecting a hidden signal within a wider spectrum, and at worst they may be incapable of detecting the signal.

BRIEF SUMMARY

The present invention extends to techniques for efficiently detecting the presence of a hidden signal using frequency domain multiplication. A detector system configured in accordance with the techniques of the present invention can be employed to search for a hidden signal across a wide spectrum in real time. Unlike with traditional techniques which serially process smaller portions of spectrum thereby creating blind time gaps, the detector system can divide multiple antenna inputs into a series of blocks and then convert these blocks to the frequency domain possibly in a parallel fashion. Corresponding blocks from each input can then be conjugate multiplied, and the results of this conjugate multiplication can then be averaged over time. If a signal is hidden in the inputs, this averaging will reduce the noise floor thereby revealing the presence of the hidden signal at a particular frequency.

In one embodiment, the present invention is implemented as a detector system that includes: a first component configured to receive a first signal from a first antenna and to output a first stream of samples; a second component configured to receive a second signal from a second antenna and to output a second stream of samples; a first subband component that performs a windowing function on the first stream of samples to periodically generate a number of first blocks, the first subband component including a corresponding number of transform components that receive the first blocks and convert the first blocks to the frequency domain; a second subband component that performs a windowing function on the second stream of samples to periodically generate a number of second blocks, the second subband component including a corresponding number of transform components that receive the second blocks and convert the second blocks to the frequency domain; a correlation component that receives the first blocks and the second blocks and performs conjugate multiplication on corresponding pairs of blocks; and an averaging component that receives and averages results of the conjugate multiplication.

In another embodiment, the present invention is implemented as a method for detecting a signal. A first component receives a first signal from a first antenna and generates a first stream of samples from the first signal. A second component receives either a second signal from a second antenna or the first signal and generates a second stream of samples from the first or second signal. A first subband component receives the first stream and converts the first stream into a first series of blocks. The first subband component also periodically converts a number of the first blocks to the frequency domain. A second subband component receives the second stream and converts the second stream into a second series of blocks. The second subband component also periodically converts a number of the second blocks to the frequency domain. Conjugate multiplication is then performed on corresponding pairs of blocks from the first and second series of blocks. Results of the conjugate multiplication are then averaged.

In another embodiment, the present invention is implemented as a signal detection system that includes a first subband component that is configured to receive a first stream of samples. The first subband component includes a windowing function that splits the first stream of samples into a first series of blocks, a number of transform components that are arranged in parallel to periodically convert a number of the blocks in the first series to the frequency domain, and a block reordering component that reorders the number of blocks into the first series after the conversion to the frequency domain. The signal detection system also includes a second subband component that is configured to receive a second stream of samples. The second subband component includes a windowing function that splits the second stream of samples into a second series of blocks, a number of transform components that are arranged in parallel to periodically convert a number of the blocks in the second series to the frequency domain, and a block reordering component that reorders the number of blocks into the second series after the conversion to the frequency domain. The signal detection system further includes a correlation component that receives the first and second series of blocks from the first and second subband components respectively and performs conjugate multiplication on corresponding pairs of blocks from each series, and an averaging component that receives and averages results of the conjugate multiplication.

This summary is provided to introduce a selection of concepts in a simplified form that are further described below in the Detailed Description. This Summary is not intended to identify key features or essential features of the claimed subject matter.

BRIEF DESCRIPTION OF THE DRAWINGS

Understanding that these drawings depict only typical embodiments of the invention and are not therefore to be considered limiting of its scope, the invention will be described and explained with additional specificity and detail through the use of the accompanying drawings in which.

DETAILED DESCRIPTION

Figure 1:
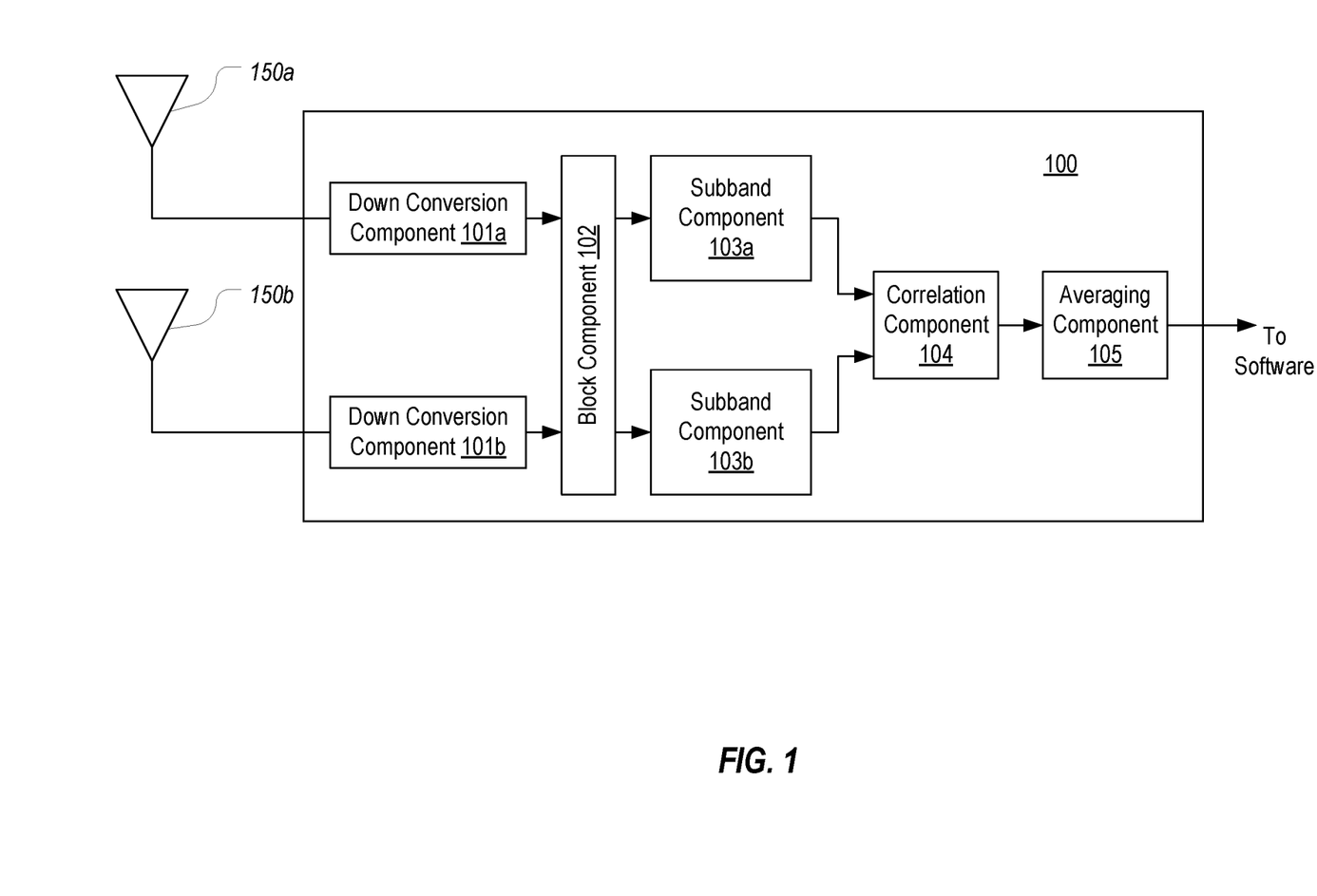
FIG. 1 provides a block diagram of a detector system that is configured in accordance with one or more embodiments of the present invention.

FIG. 1 provides a block diagram of a detector system 100 that is configured in accordance with embodiments of the present invention. In some embodiments, detector system 100 can be implemented entirely or partially on an FPGA although any suitable architecture could be employed. As shown, detector system 100 can include two inputs each of which is configured to receive a signal from an antenna 150a, 150b respectively. In FIG. 1, detector system 100 is shown in an interferometer mode in which signals from two separate antennas are processed along separate paths. Additionally, in some embodiments as will be described in detail below, detector system 100 can be employed in a radiometer mode in which a signal from one antenna is independently processed along both paths.

Although it can be employed to search for a hidden signal within any size spectrum, detector system 100 can beneficially be employed when it is necessary to identify the presence of a signal or signals within a wide spectrum (e.g., greater than 500 MHz). For illustrative purposes only, in the remainder of this description, it will assumed that antennas 150a, 150b each have a bandwidth of approximately 1.8 GHz and that detector system 100 is configured to search for hidden signals over this 1.8 GHz spectrum.

Detector system 100 includes two down conversion components 101a and 101b which function to convert the signals received from antennas 150a, 150b into digitally downconverted samples. As an example, each of down conversion components 101a and 101b can be configured to perform analog-to-digital conversion, quadrature down conversion, digital phase shifting, filtering, etc. such that their outputs comprise a stream of complex digital samples. Although it will be assumed that down conversion components 101a, 101b include ADCs, in some embodiments, the ADCs may be separate components positioned upstream of the down conversion components. It is also noted that, in some embodiments, down conversion may not be required. In such embodiments, down conversion components 101a, 101b could be replaced with ADCs.

These streams can then be input to a block component 102 that is configured to delineate corresponding blocks (or windows) within each stream. By way of example only, a block may consist of a sequence of 512 8-bit samples (i.e., 4096 bits). In some embodiments, a block may include separate sequences of real and imaginary components, while in other embodiments, a block may include a single sequence of complex values. Alternatively, when down conversion is not performed, a block may include a sequence of real values. Accordingly, block component 102 can identify blocks in each stream that contain samples for the same time period so that these corresponding blocks can be subsequently correlated.

With blocks defined, the streams can be input to subband components 103a, 103b for further processing. As will be described in detail below, this processing includes dividing the stream into the defined blocks (e.g., using a windowing function) and then performing a fast Fourier transform on a number of blocks in parallel. This parallel processing facilitates the ability to instantaneously search over a wide spectrum. Subband components 103a, 103b can reorder the blocks, which will now represent the input signals in the digital domain, and then output the ordered blocks to correlation component 104.

Although the specification will describe embodiments where subband components 103a, 103b employ a parallel arrangement of FFT components to increase throughput, the present invention could equally be implemented using a single FFT component as long as the single FFT component can output blocks of frequency domain samples at a sufficient rate. In such embodiments, block component 102 could still be employed to define the boundaries of each block to be converted to the frequency domain and then output to correlation component 104. Also, other types of transform components rather than FFT components could equally be employed in some embodiments.

Correlation component 104 can be configured to perform a conjugate multiplication on each pair of corresponding blocks. In this way, correlation is performed in the frequency domain. If a signal is present in the inputs, the conjugate multiplication of the blocks will consistently yield higher values at the signal frequency than at other frequencies because the arbitrary noise at the other frequencies will vary over time. Correlation component 104 can then pass the results of the conjugate multiplication to averaging component 105 which can average the results over a period of time to reduce the noise floor relative to the signal. In some embodiments, averaging component 105 can be configured to periodically dump the accumulated results to software which can perform additional averaging to better identify the presence of a signal. In this way, even a signal hidden deep in the noise floor can eventually be detected.

Figure 2A:
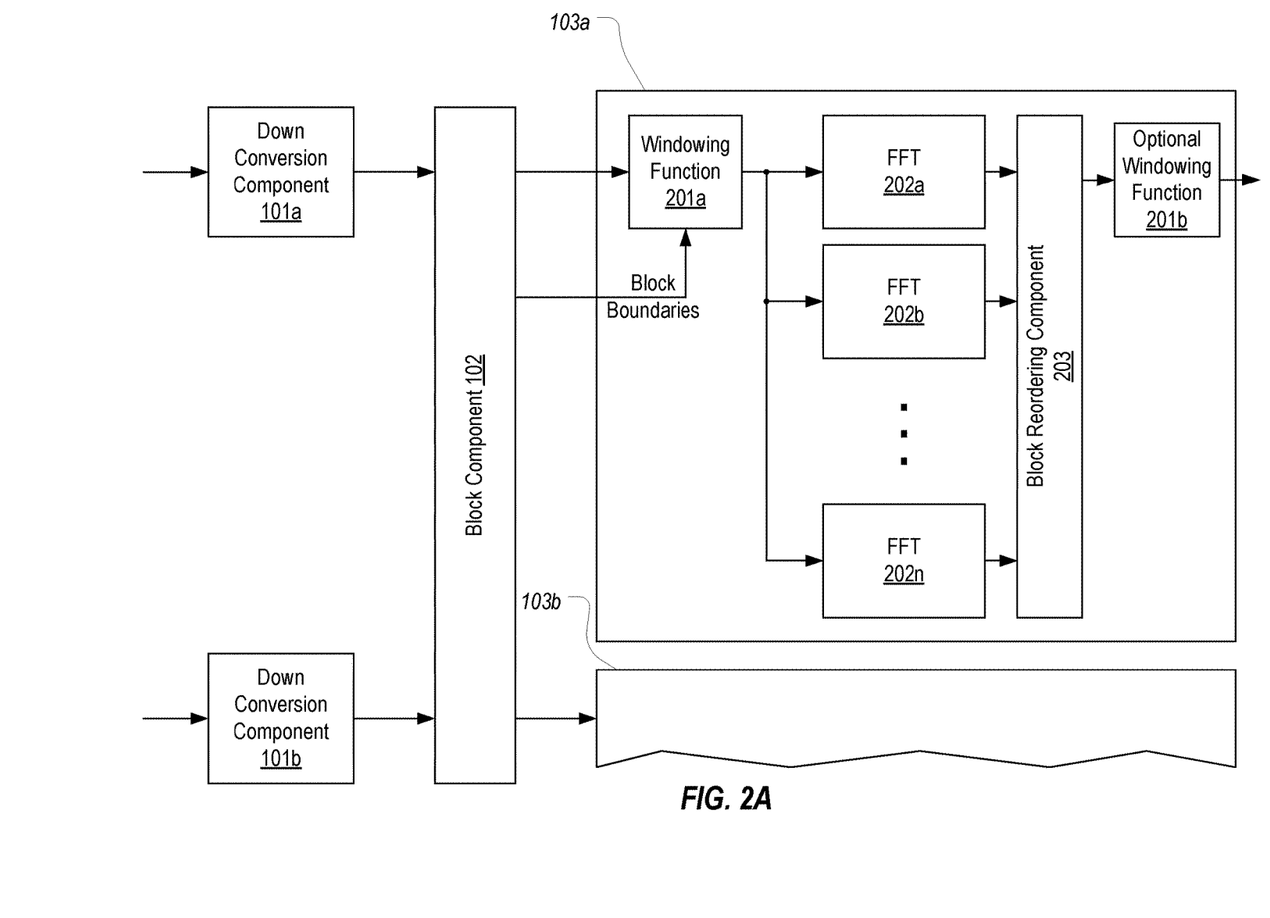
FIGS. 2A and 2B provide a more detailed view of the detector system of FIG. 1.

FIG. 2A provides a more detailed view of how subband components 103a, 103b can be configured in accordance with some embodiments of the present invention. For ease of illustration, only the details of subband component 103a are shown. However, subband component 103b can be similarly configured. As shown, down conversion component 101a can receive a real, time domain signal from antenna 150a and convert it into complex values at baseband. As any suitable digital down converter could be employed to perform this conversion, a detailed explanation will not be provided. Suffice it to say that the output of each down conversion component will be a stream of complex samples at a desired rate (e.g., 900 Msps). As indicated above, in some embodiments, the real and imaginary components of the stream may be divided into two separate sequences. Also, as indicated above, in some embodiments, down conversion may not be implemented such that the outputs of components 101a, 101b are streams of real samples.

The stream of samples output from down conversion components 101a, 101b can then be supplied to block component 102. Block component 102 can be configured to define the boundaries of each block, such as, for example, by identifying the beginning and ending samples for each block. As shown, block component 102 can interface with a windowing function component 201*a* of subband component 103*a* to provide these block boundaries. In some embodiments, blocks may be contiguous while in other embodiments, blocks may overlap or may be spaced apart. Although not shown, block component 102 can similarly interface with a windowing function component of subband component 103*b* to thereby provide corresponding block boundaries for the stream received from down conversion component 101*b*. In short, block component 102 defines blocks in each stream that correspond to the same time period. Each block will therefore contain time domain data of the corresponding signal for a particular period of time.

Based on the boundaries defined by block component 102, windowing function component 201*a* can repeatedly apply a windowing function on the stream to thereby extract the blocks for independent and parallel processing. As is known, this is accomplished by performing a point-by-point multiplication between the samples within the block boundaries and the samples from the programmed window shape. A number of different windowing functions could be employed depending on a target environment and/or implementation. For example, a rectangular windowing function may be employed to provide tight frequency resolution and high energy dispersion whereas a Blackman-Harris windowing function may be employed to provide loose frequency resolution and low energy dispersion. In some embodiments, the windowing function and/or its shape can be dynamically defined (i.e., at runtime) to suit a particular signal detection target.

As shown, subband component 103*a* can include a number of fast Fourier transform (FFT) components 202*a*-202*n* where n represents some integer. For example, in some embodiments, each subband component 103*a*, 103*b* may include eight FFT components. Each of FFT components 202*a*-202*n* can be configured to receive a block from windowing function component 201*a* and to perform a fast Fourier transform on the block to convert it to the frequency domain. FFT components 202*a*-202*n* can be configured to operate in parallel such that a number of blocks are converted to the frequency domain with each iteration.

In some embodiments, the FFT component(s) could be replaced with components that perform another type of transform. For example, discrete Hartley transform or discrete cosine transform components could be employed to convert the blocks to the frequency domain. Accordingly, the specific type of transform that is employed to convert the blocks to the frequency domain is not essential to the invention.

The output of each of FFT components 202*a*-202*n* (i.e., the blocks of frequency domain data) can then be provided to a block reordering component 203 that is tasked with placing the blocks in the proper order such that the output of block reordering component 203 is a sequence of blocks. It is noted that a block reordering component in subband component 103*b* would likewise output a corresponding sequence of blocks. Also, in embodiments where a single FFT (or other transform) component is employed, the subband component would not include a block reordering component.

Subband component 103*a* is also shown as including an optional windowing function component 201*b* which can be employed in instances where it may be known that a jamming signal is present in the signal. In such cases, optional windowing function component 201*b* can employ a suitable windowing function to remove the jamming signal from each block prior to the block being output from sideband component 103*a*. This can be accomplished by performing a point-by-point multiplication between the frequency domain samples (i.e., "frequency bins") in each block and the corresponding samples of the desired window.

Figure 2B:
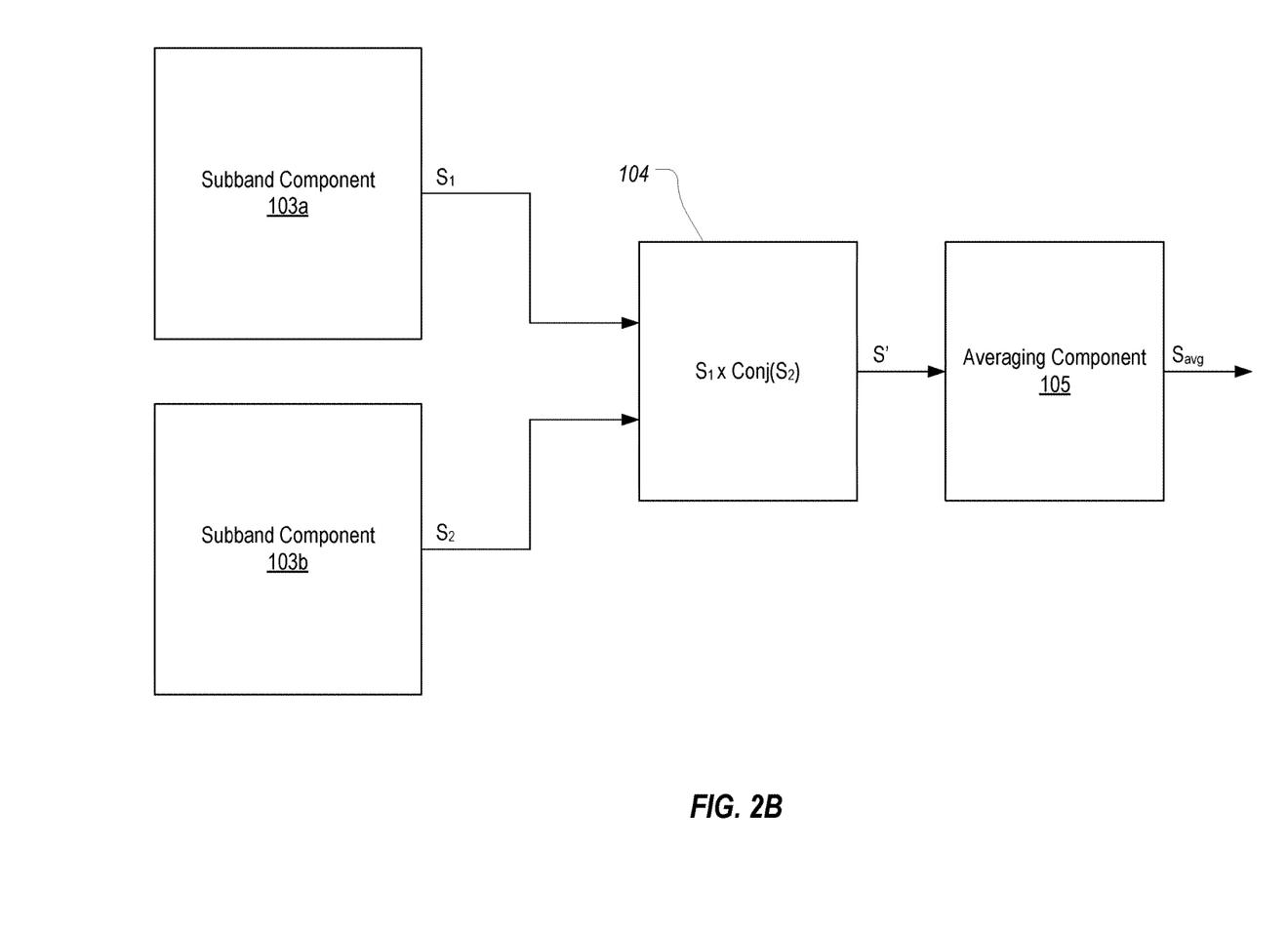

Turning now to FIG. 2B, correlation component 104 is shown as receiving the streams of frequency domain samples from each of subband components 103*a*, 103*b*. In this example, the stream from subband component 103*a* is represented as $S_1$ whereas the stream from subband component 103*b* is represented as $S_2$. Correlation component 104 can perform conjugate multiplication on the two streams thereby yielding a stream (S') of samples. Correlation component 104 can be configured to perform this conjugate multiplication on a block-by-block basis by performing point-by-point multiplication of the corresponding frequency bins in the corresponding two blocks of frequency domain data. More specifically, correlation component 104 will conjugate multiply a block from stream S1 representing a particular time period (which time period would be defined by block component 102) with a block from stream S2 representing this same time period. This conjugate multiplication would be performed on a point-by-point basis for each frequency bin in the blocks. Block reordering component 203 can be tasked with providing the blocks to correlation component 104 in the proper order to ensure that corresponding blocks are conjugate multiplied.

Correlation component 104 can output the results of conjugate multiplying corresponding blocks from the two streams to averaging component 105 which can then average the results on a per frequency bin basis over a period of time (i.e., averaging component 105 averages over time the value for each frequency bin). The averaged results, $S_{avg}$, can then be output for further processing. For example, detector component 100 could be coupled to a processing device which may perform further averaging and/or may process the averaged results to determine whether a signal is present at a particular frequency.

Figure 3A:
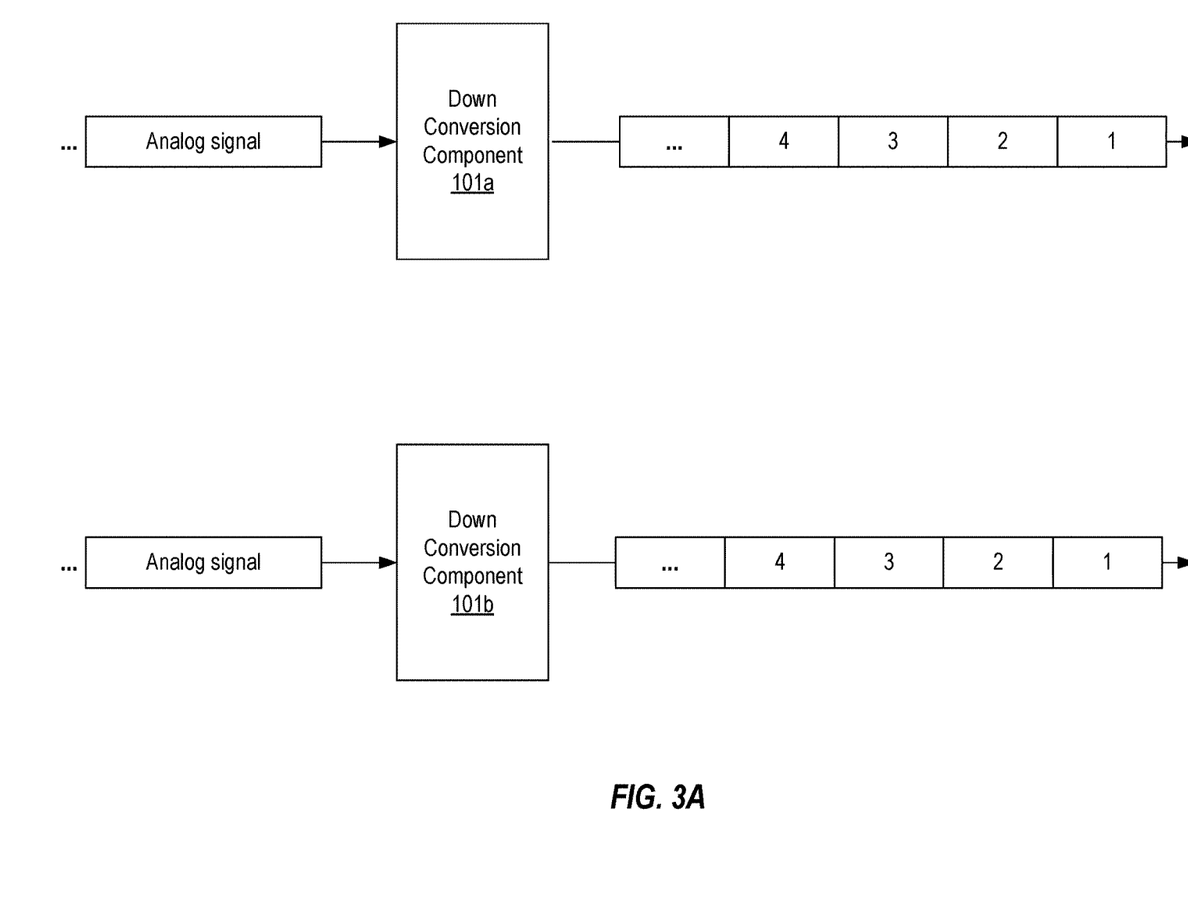
FIGS. 3A-3E provide a graphical representation of how the detector system can process signals received from two antennas.
Figure 3B:
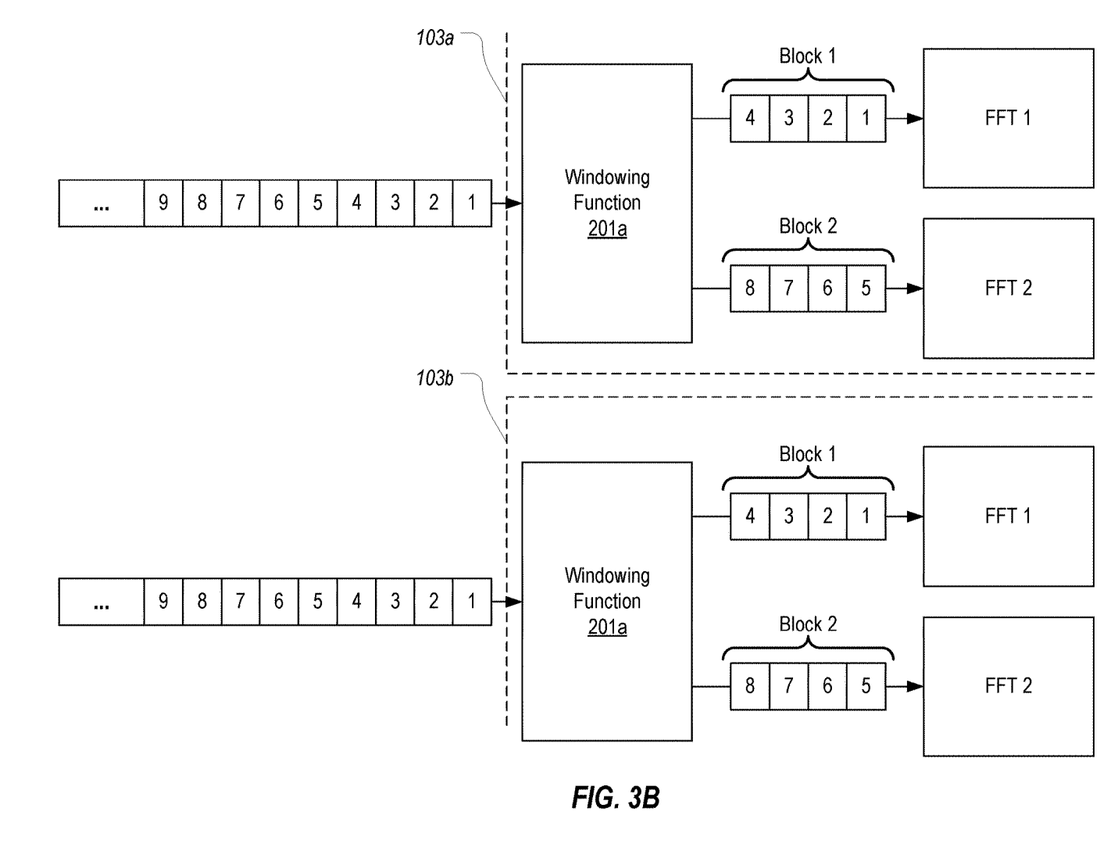

FIGS. 3A-3E depict a simplified example of how data can be processed through detector system 100. In FIG. 3A, down conversion components 101*a*, 101*b* are both shown as receiving an analog signal. In interferometer mode, these two signals would be received from two different antennas. In contrast, in radiometer mode, a signal from a single antenna would be supplied to each down conversion component 101*a*, 101*b*. Alternatively, in some embodiments, a signal from a single antenna could be passed through a single digital down converter and then routed along the two separate paths (e.g., by supplying the output of a digital down converter in down conversion component 101*a* to a digital phase shifter in down conversion component 101*a* and to a digital phase shifter in down conversion component 101*b* as shown in FIG. 4).

In either case, each down conversion component 101*a*, 101*b* will output a stream of digital samples consisting of a sequence of complex samples. As shown in FIG. 3B, these streams will be input to windowing function component 201*a* in the corresponding subband component 103*a*, 103*b*.

For ease of illustration, it will be assumed that windowing function component 201*a* is configured to create blocks spanning four samples and that each subband component 103*a*, 103*b* includes just two FFT components. Accordingly, FFT 1 in each subband component can be configured to receive and process block 1 (which is assumed to encompass samples 1-4) and FFT 2 in each subband component can be configured to receive and process block 2 (which is assumed to encompass samples 5-8) in a parallel manner. In this example, in subsequent iterations, FFT 1 would receive and process blocks 3, 5, 7, etc. while FFT 2 would receive and process blocks 4, 6, 8, etc.

Figure 3C:
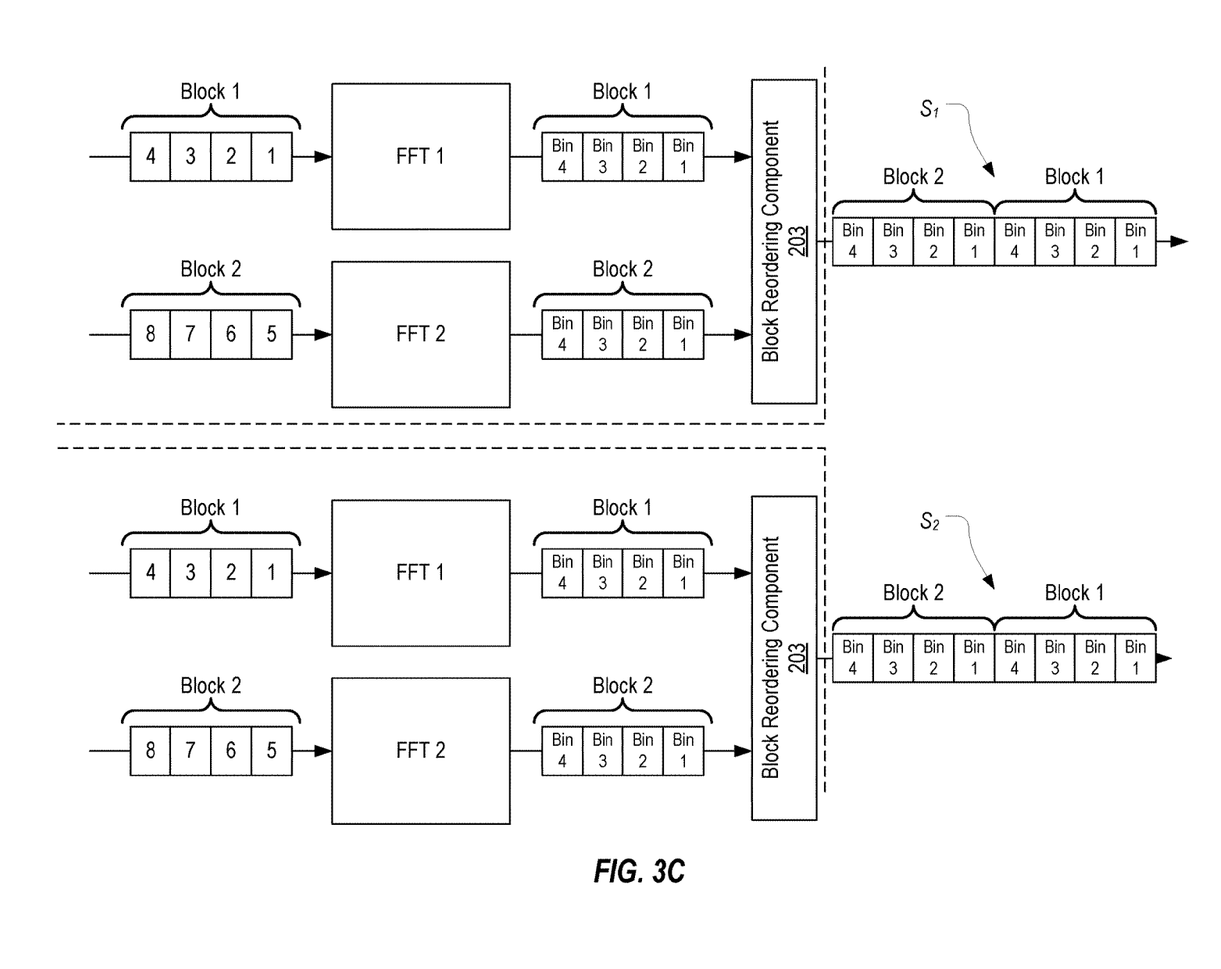
Figure 4:
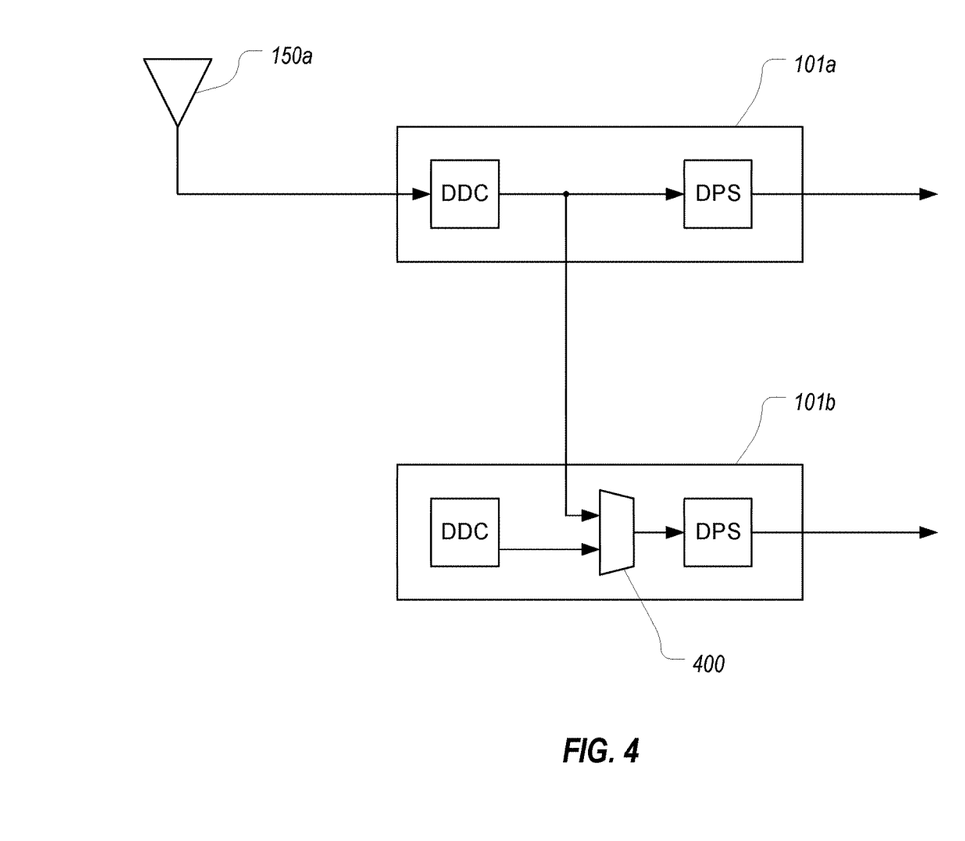
FIG. 4 illustrates how the detector system can be employed in a radiometer mode.

In FIG. 3C, FFT 1 and FFT 2 in subband components 103a, 103b are shown as converting the block 1 and block 2 data to the frequency domain. For illustrative purposes, the frequency domain blocks produced in subband component 103a are represented as $S_1$ while the frequency domain blocks produced in subband component 103b are represented as $S_2$. Also, for illustrative purposes, it is assumed that the blocks of frequency domain data will include four frequency bins, although in actual implementations, the number of frequency bins would be much higher (e.g., 4096). The frequency domain blocks are then passed to block reordering component 203 which then outputs the blocks in the proper order.

Figure 3D:
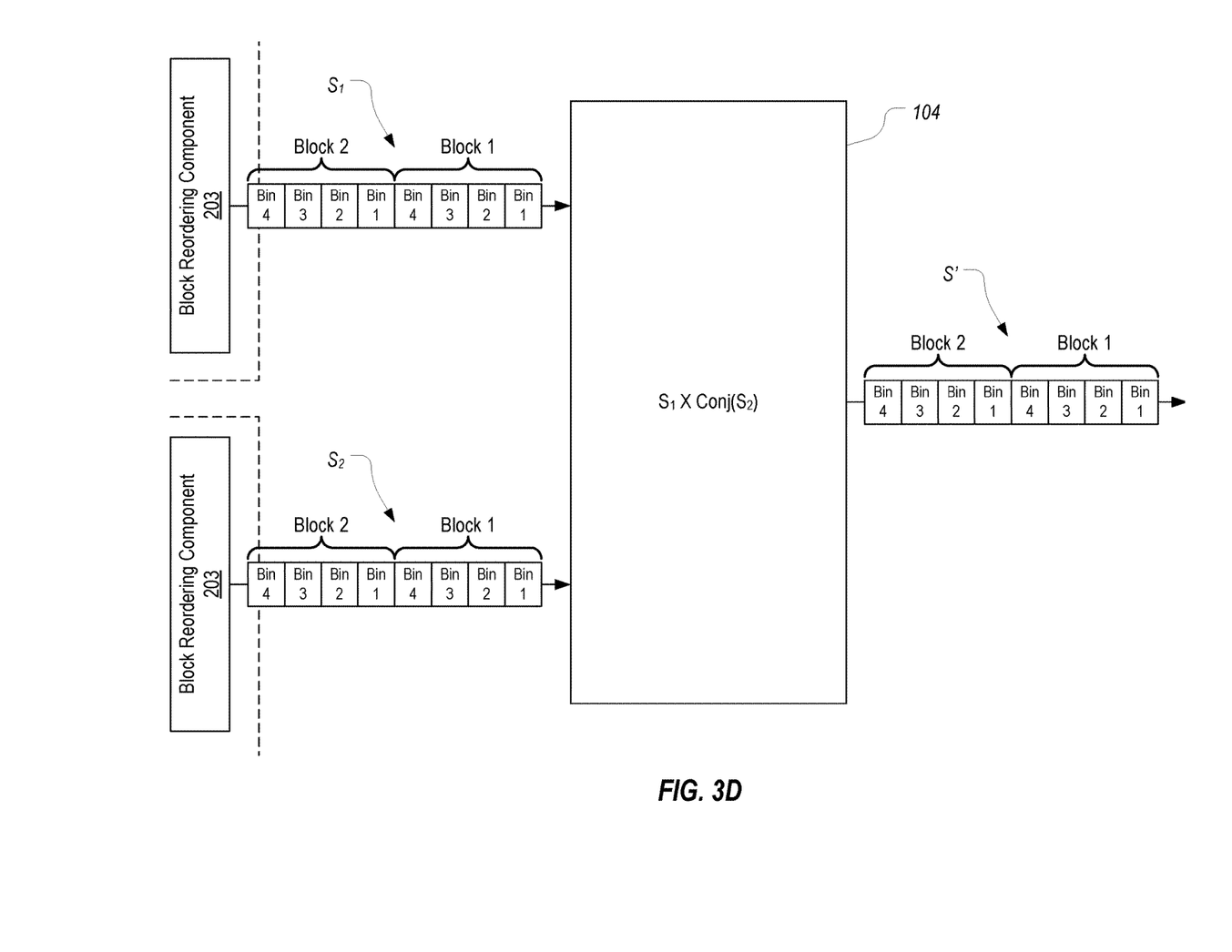

FIG. 3D illustrates how the blocks can be input to correlation component 104 in order. Correlation component 104 then conjugate multiplies the corresponding blocks. For example, correlation component 104 could generate the conjugate of each frequency bin in blocks received from subband component 103b and then multiply each conjugate with the corresponding frequency bin in the corresponding block received from subband component 103a or vice versa. As a particular example, correlation component 104 could generate the conjugate of bin 1 in block 1 of $S_2$ (e.g., $a_{S2B1bin1}-jb_{S2B1bin1}$) and multiply it with bin 1 in block 1 of $S_1$ (e.g., $(a_{S1B1bin1}+jb_{S1B1bin1}) \times (a_{S2B1bin1}-jb_{S2B1bin1})$). This same conjugate multiplication would then be performed on a bin-by-bin basis for each bin in block 1 and then for each bin in block 2, etc.

Figure 3E:
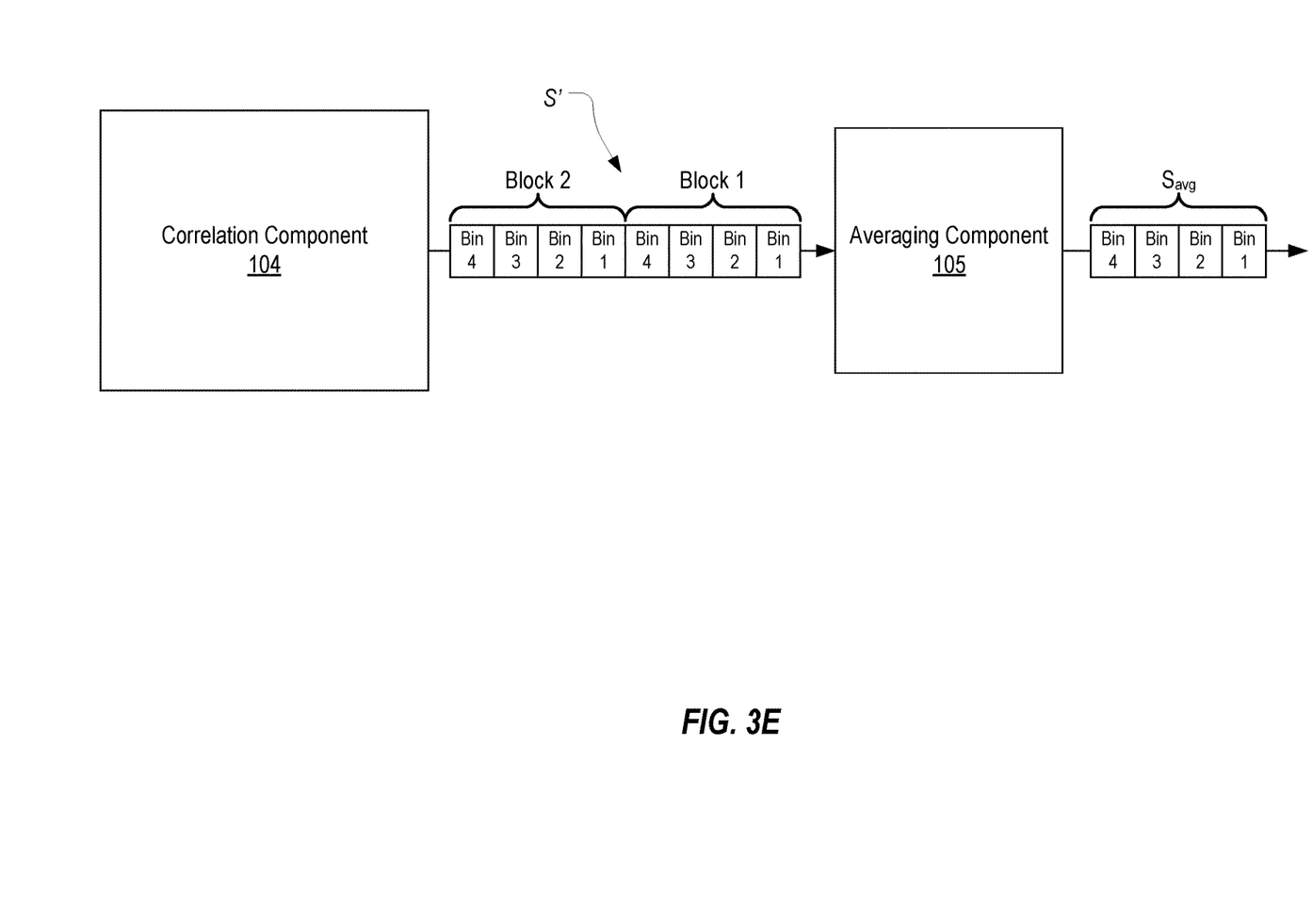

Correlation component 104 can then output the results S' of conjugate multiplying each block. These results will consist of a single sequence of blocks where the frequency bins in each block represent the results of the conjugate multiplication. Finally, as shown in FIG. 3E, averaging component 105 can receive blocks over a period of time and generate an average $S_{avg}$ for each frequency bin. After the period of time, the average value for each frequency bin can be dumped for further processing and/or analysis by software.

As mentioned above, when a signal is present at a particular frequency, the average value of the corresponding frequency bin will be higher than the average value of a frequency bin encompassing noise. This is because the power level of the noise at a particular frequency will vary over time while the power level of a signal at a particular frequency will remain relatively constant. This averaging will therefore eventually cause the noise floor to fall below the signal thereby revealing the presence of the signal at the particular frequency. By performing the correlation and averaging in the frequency domain, this signal detection method can be performed efficiently and accurately even over large spectrums.

FIG. 4 illustrates how detector system 100 can be configured to enable operation in either interferometer mode or radiometer mode. As shown, each of down conversion components 101a, 101b can include a digital down converter and a digital phase shifter (among possibly other components), while down conversion component 101b can also include a multiplexer 400. When in radiometer mode, multiplexer 400 can be configured to select the samples produced by the digital down converter in down conversion component 101a such that these samples will be processed independently along both paths. In this way, signal detection can be performed even when a single antenna is used.

Figure 5:
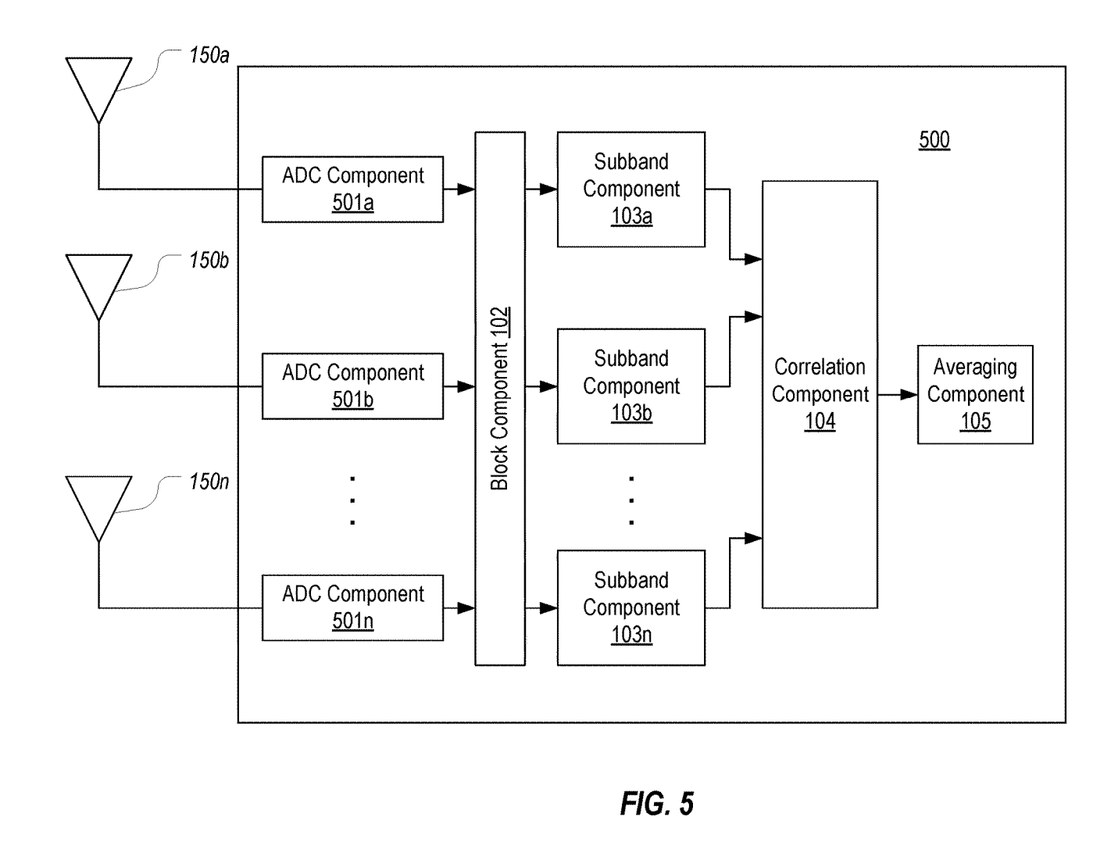
FIG. 5 provides a block diagram of another detector system that is configured in accordance with one or more embodiments of the present invention.

Although detector system 100 has been described as including two parallel paths for providing blocks to correlation component 104, a detector system in accordance with embodiments of the present invention could include any reasonable number of paths such as is shown in FIG. 5. In FIG. 5, detector system 500 includes ADC components 501a-501n where n represents some integer greater than two. As mentioned above, ADC components 501a-501n could be configured similar to down conversion components 101a, 101b in embodiments when down conversion is required or may simply include an ADC when down conversion is not desired.

Detector system 500 also includes a corresponding number of subband components 103a-103n. In this way, n different signals from antennas 150a-150n (or from fewer antennas when the same antenna signal is routed over multiple paths) can be processed in parallel to increase the rate at which a hidden signal can be detected.

Each of subband components 103a-103n can be configured as described above. For example, each subband component 103a-103n can include a windowing function, one or more transform components, a reordering component (when more than one transform component is employed), and possibly a second windowing function.

Correlation component 104 can be configured in substantially the same manner as described above except that it will perform conjugate multiplication on each possible pair of blocks. For example, when n equals three, correlation component can perform three conjugate multiplications for each time period. Specifically, correlation component 104 would: (1) multiply corresponding blocks from streams 1 and 2; (2) multiply corresponding blocks from streams 1 and 3; and (3) multiply corresponding blocks from streams 2 and 3. As can be seen, the greater the number of streams, the greater the rate at which results of conjugate multiplication will be produced (e.g., accumulation will occur three times faster when three paths are employed rather than two, or six times faster when four paths are employed rather than two). This will in turn cause the noise floor to be averaged out more quickly.

In summary, a detection system can include two or more parallel pathways for generating blocks of frequency domain data that can then be conjugate multiplied and averaged to identify whether a signal is hidden in the noise floor. Each of these pathways can receive a signal from a different antenna (in interferometer mode) or from the same antenna (in radiometer mode). Each of these pathways may also include a component for producing digital samples from the received signal and, in some embodiments, for performing down conversion. Each of these pathways may further include a subband component that creates blocks of time domain data and then converts the blocks to the frequency domain. These subband components may employ a single transform component to generate frequency domain blocks serially or may employ multiple transform components to generate frequency domain blocks in parallel.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description.

What is claimed:

1. A detector system comprising:
a first component configured to receive a first signal from a first antenna and to output a first stream of samples;

a second component configured to receive a second signal from a second antenna and to output a second stream of samples;

a first subband component that performs a windowing function on the first stream of samples to periodically generate a number of first blocks, the first subband component including a corresponding number of transform components that receive the first blocks and convert the first blocks to the frequency domain;

a second subband component that performs a windowing function on the second stream of samples to periodically generate a number of second blocks, the second subband component including a corresponding number of transform components that receive the second blocks and convert the second blocks to the frequency domain;

a correlation component that receives the first blocks and the second blocks and performs conjugate multiplication on corresponding pairs of blocks; and an averaging component that receives and averages results of the conjugate multiplication.

2. The detector system of claim 1, further comprising:

one or more additional components that are each configured to receive an additional signal from an additional antenna and to output an additional stream of samples; and an additional subband component for each of the one or more additional components, each additional subband component performing a windowing function on the corresponding additional stream of samples to periodically generate a number of additional blocks, the additional subband component including a corresponding number of transform components that receive the additional blocks and convert the additional blocks to the frequency domain; and wherein the correlation component also receives the additional blocks from each additional subband component and performs conjugate multiplication on corresponding pairs of blocks received from the first, second, and one or more additional subband components.

3. The detector system of claim 1, wherein the number of transform components is greater than one and each of the first and second subband components includes a block reordering component that receives the first or second blocks respectively from the transform components and outputs the first or second blocks respectively in order.

4. The detector system of claim 1, wherein each of the first and second subband components is also configured to perform a second windowing function on the first or second blocks respectively after the blocks have been converted to the frequency domain.

5. The detector system of claim 1, wherein the number of transform components in each of the first and second subband components is one.

6. The detector system of claim 1, wherein performing conjugate multiplication comprises generating the conjugate of each frequency bin in one of the second blocks and multiplying the conjugate of each frequency bin with a corresponding frequency bin in a corresponding one of the first blocks.

7. The detector system of claim 1, wherein the second subband component includes a multiplexer that is configured to cause either the second stream of samples or the first stream of samples to be provided to the second subband component.

8. The detector system of claim 7, wherein the first and second components each include a digital down converter that generates the first or second stream respectively, and wherein the multiplexer includes inputs for receiving the first and second streams.

9. The detector system of claim 1, wherein the averaging component periodically outputs the averaged results to memory for further processing.

10. The detector system of claim 1, wherein the first and second components are first and second down conversion components.

11. A method for detecting a signal comprising:

receiving, at a first component, a first signal from a first antenna;

generating, by the first component, a first stream of samples from the first signal;

receiving, at a second component, either a second signal from a second antenna or the first signal;

generating, by the second component, a second stream of samples from the first or second signal;

receiving, at a first subband component, the first stream and converting the first stream into a first series of blocks;

periodically converting a number of the first blocks to the frequency domain;

receiving, at a second subband component, the second stream and converting the second stream into a second series of blocks;

periodically converting a number of the second blocks to the frequency domain;

performing conjugate multiplication on corresponding pairs of blocks from the first and second series of blocks; and averaging results of the conjugate multiplication.

12. The method of claim 11, wherein receiving either a second signal from a second antenna or the first signal comprises receiving the first signal after the first signal has been converted into the first stream of samples such that the second stream of samples is generated from the first stream of samples.

13. The method of claim 11, wherein converting the first and second streams into the first and second series of blocks comprises applying a windowing function to the first and second streams.

14. The method of claim 11, wherein periodically converting a number of the first blocks to the frequency domain comprises periodically converting a plurality of the first blocks to the frequency domain in parallel, and wherein periodically converting a number of the second blocks to the frequency domain comprises periodically converting a plurality of the second blocks to the frequency domain in parallel.

15. The method of claim 14, further comprising:

reordering the first and second blocks into the first and second series respectively after conversion to the frequency domain.

16. The method of claim 11, further comprising:

receiving, at a third component, a third signal from a third antenna;

generating, by the third component, a third stream of samples from the third signal;

receiving, at a third subband component, the third stream and converting the third stream into a third series of blocks; and periodically converting a number of the third blocks to the frequency domain;

wherein performing conjugate multiplication on corresponding pairs of blocks from the first and second series of blocks further includes:

performing conjugate multiplication on corresponding pairs of blocks from the first and third series of blocks; and performing conjugate multiplication on corresponding pairs of blocks from the second and third series of blocks.

17. The method of claim 11, wherein the first and second components comprise first and second down conversion components.

18. The method of claim 11, wherein the first and second streams of samples are passed through a block component that defines boundaries of each block.

19. A signal detection system comprising:
   a first subband component that is configured to receive a first stream of samples, the first subband component comprising:
      a windowing function that splits the first stream of samples into a first series of blocks;
      a number of transform components that are arranged in parallel to periodically convert a number of the blocks in the first series to the frequency domain; and
      a block reordering component that reorders the number of blocks into the first series after the conversion to the frequency domain;
   a second subband component that is configured to receive a second stream of samples, the second subband component comprising:
      a windowing function that splits the second stream of samples into a second series of blocks;
      a number of transform components that are arranged in parallel to periodically convert a number of the blocks in the second series to the frequency domain; and
      a block reordering component that reorders the number of blocks into the second series after the conversion to the frequency domain;
   a correlation component that receives the first and second series of blocks from the first and second subband components respectively and performs conjugate multiplication on corresponding pairs of blocks from each series; and
   an averaging component that receives and averages results of the conjugate multiplication.

20. The signal detection system of claim 19, further comprising:
   one or more additional subband components that are each configured to receive an additional stream of samples, each additional subband component comprising:
      a windowing function that splits the additional stream of samples into an additional series of blocks;
      a number of transform components that are arranged in parallel to periodically convert a number of the blocks in the additional series to the frequency domain; and
      a block reordering component that reorders the number of blocks into the additional series after the conversion to the frequency domain; and
   wherein the correlation component also receives each additional series of blocks from the one or more additional subband components and performs conjugate multiplication on each corresponding pair of blocks from each of the first, second, and one or more additional series.

* * * * *